United States Patent
Jeong

(10) Patent No.: US 7,509,451 B2
(45) Date of Patent: Mar. 24, 2009

(54) METHOD AND CIRCUIT FOR UPDATING A SOFTWARE REGISTER IN SEMICONDUCTOR MEMORY DEVICE

(75) Inventor: Duk Ju Jeong, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 691 days.

(21) Appl. No.: 11/160,297

(22) Filed: Jun. 17, 2005

(65) Prior Publication Data

US 2006/0112385 A1     May 25, 2006

(30) Foreign Application Priority Data

Nov. 15, 2004   (KR) ...................... 10-2004-0093178

(51) Int. Cl.
*G06F 12/00*   (2006.01)

(52) U.S. Cl. ....................................... 711/104; 711/109

(58) Field of Classification Search ........................ None
See application file for complete search history.

(56) References Cited

U.S. PATENT DOCUMENTS

| | | | |
|---|---|---|---|
| 5,808,948 A | 9/1998 | Kim et al. | |
| 5,958,045 A * | 9/1999 | Pickett | ........................ 712/229 |
| 5,973,988 A | 10/1999 | Nakahira et al. | |
| 6,459,651 B1 | 10/2002 | Lee et al. | |
| 6,522,600 B2 | 2/2003 | Ohshima et al. | |
| 6,573,753 B1 | 6/2003 | Snyder | |
| 6,697,296 B2 | 2/2004 | Matsumoto et al. | |

FOREIGN PATENT DOCUMENTS

| JP | 08-124380 | 5/1996 |
|---|---|---|
| JP | 2004-146046 | 5/2004 |

* cited by examiner

*Primary Examiner*—Hyung S Sough
*Assistant Examiner*—Ngoc V Dinh
(74) *Attorney, Agent, or Firm*—Marshall, Gerstein & Borun LLP

(57) ABSTRACT

A method and circuit for updating a software register is disclosed, wherein the software register is updated using data received through a data I/O pad, and the updated data is read and transferred to the outside through the data I/O pad. The disclosed method of updating the software register includes the steps of receiving necessary data from a data I/O pad, writing the data received from the data I/O pad into the software register, thereby updating the software register, and reading the updated data from the software register, and transferring the data to the outside through the data I/O pad.

21 Claims, 9 Drawing Sheets

METHOD AND CIRCUIT FOR UPDATING A SOFTWARE REGISTER IN SEMICONDUCTOR MEMORY DEVICE

CROSS REFERENCE TO RELATED APPLICATIONS

This application relies for priority upon Korean Patent Application No. 2004-93178 filed on Nov. 15, 2004, the contents of which are herein incorporated by reference in their entirety.

TECHNICAL FIELD

The present patent relates to a semiconductor memory device, and more specifically, to a method and circuit for updating a software register, wherein a mode register is updated using data necessary for setting the mode register, which are received from a data I/O pad.

DISCUSSION OF RELATED ART

In pseudo SRAM (Static Random Access Memory), a mode register and a mode register set (MRS) are used. A place where various operating modes of pseudo SRAM are set and stored is the mode register. A collection of a series of these mode registers is called MRS.

In a software register update method used in pseudo SRAM, i.e., a mode register update method, a mode register is updated using an address necessary for mode register setting, which is always received from the outside. The method in which a mode register is updated using an externally input address in order to set the mode register to an operating mode desired by a user has a problem in that an update result cannot be read.

Furthermore, recently there is a need to update a mode register by using data necessary for mode register setting, which is received through a data I/O pad, due to interface with a flash memory.

SUMMARY

Accordingly, the present patent has been made in view of the above problems, and it is an object of the present patent to provide a method and circuit for updating a software register, wherein data received through a data I/O pad are updated into the software register, and the updated data are read and transferred to the outside through the data I/O pad.

To accomplish this, there is provided a method of updating a software register, including the steps of receiving necessary data from a data I/O pad, writing the data received from the data I/O pad into the software register, thereby updating the software register, and reading the updated data from the software register, and transferring the data to the outside through the data I/O pad.

Also, there is provided a circuit for updating a software register by using necessary data received from a data I/O pad, including a first register control signal generator that generates a first read control signal and a first write control signal for updating the software register, a second register control signal generator for generating a second read control signal using the first read control signal, and generating a second write control signal and a third read control signal using the first write control signal, and a register update unit for updating the software register by writing the data received from the data I/O pad into the software register, or reading the updated data from the software register, so that the first to third read control signals, and the first and second write control signals are enabled.

In order to set a mode register, relevant data is received through a data I/O pad, and the mode register is updated using the received data, thereby setting the mode register to an operating mode desired by a user.

DETAILED DESCRIPTION OF VARIOUS EMBODIMENTS

Various embodiments will be described with reference to the accompanying drawings.

Figure 1:
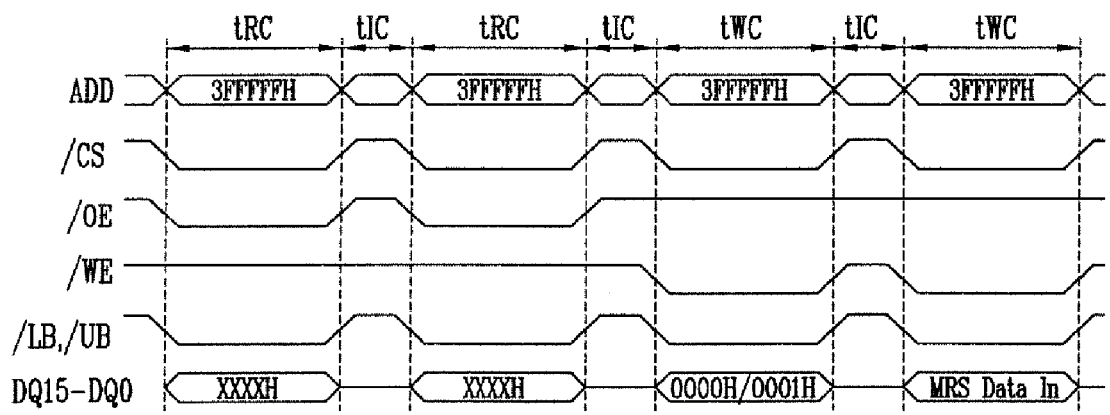
FIG. 1 is a timing diagram showing a write operation of software register update according to an exemplary embodiment.
Figure 2:
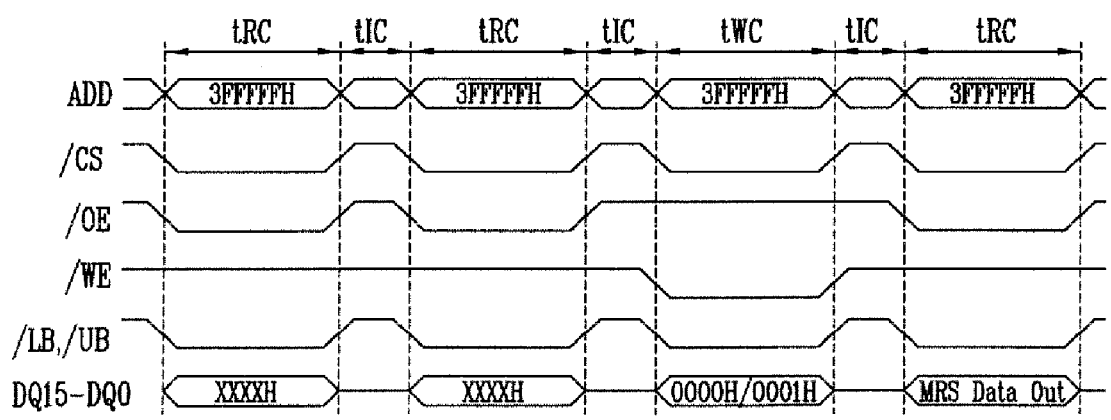
FIG. 2 is a timing diagram showing a read operation of a software register update according to an exemplary embodiment.

FIGS. 1 and 2 show a method of updating a software register of a semiconductor memory device according to an exemplary embodiment. FIG. 1 is a timing diagram showing a write operation of software register update according to an exemplary embodiment. FIG. 2 is a timing diagram showing a read operation of software register update according to an exemplary embodiment. For example, the software register may be a mode register constructed to a semiconductor memory device.

The term "software register update" means that when a last address is consecutively accessed four times, setting of a mode register is completed using data received through a data I/O pad.

In FIGS. 1 and 2, tRC is a read cycle time, tWC is a write cycle time, and tIC is a dummy cycle. It is require that tRC and tWC be about 70 ns, and tIC be 10 ns or more. 3FFFFFH indicates a last address on the basis of 64 M PSRAM.

In FIG. 1, for a write operation of software register update, two read cycle times and two write cycle times have to be consecutively performed on the last address except for the period tIC. As in FIG. 1, in a fourth write cycle time, the mode register is set using data received through DQ15-DQ0.

In FIG. 2, for a read operation of software register update, two read cycle times, one write cycle time, and one read cycle time have to be consecutively performed on a last address except for the period tIC. In a fourth read cycle time, updated data is read from an MRS (Mode Register Set). These read data are transferred to the outside through DQ0-15.

For the write or read operation of software register update, a chip select bar signal /CS, an output enable bar signal /OE, a write enable bar signal /WE, a lower bit bar signal /LB of output data, and an upper bit bar signal /UB of output data have to be toggled in the same manner as the timings of FIGS. 1 and 2. Of course, if it is not the last address, the control signals /CS, /WE, /OE, /LB and /UB are not toggled in the same as the timings of FIGS. 1 and 2, or the cycle time sequence of tRC/tWC does not coincide with FIGS. 1 and 2, a software register update circuit does not operate.

Figure 3:
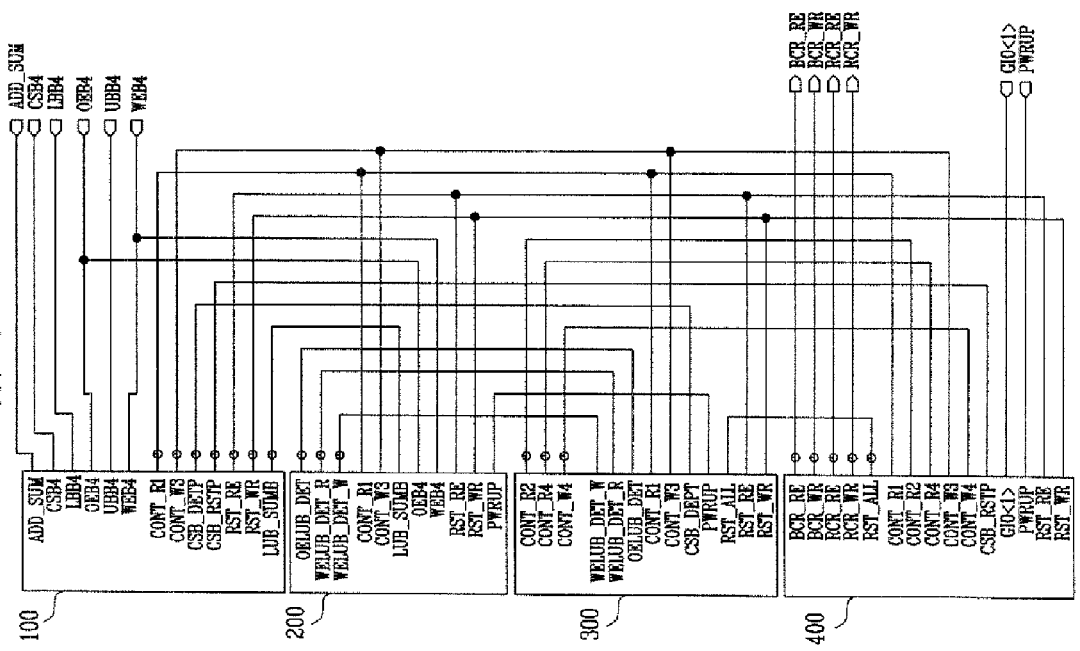
FIG. 3 is a block diagram illustrating a software register update circuit according to an exemplary embodiment.

FIG. 3 is a block diagram illustrating a software register update circuit for performing the read and write operations of software register update in FIGS. 1 and 2.

Referring to FIG. 3, the software register update circuit includes a first update control signal generator 100, a second update control signal decision unit 200, a second update control signal generator 300, and a register update unit 400.

Reference numerals in FIG. 3 are described first. WEB4, OEB4, LBB4, UBB4 and CSB4 are buffered signals of the write enable bar signal /WE, the output enable bar signal /OE, the lower bit bar signal /LB of the output data, the upper bit bar signal /UB of the output data, and the chip select bar signal /CS, and they have the same phase as those of /WE, /OE, /LB, /UB and /CS. Reference numerals WEB4, OEB4, LBB4, UBB4 and CSB4 have the same reference numerals as those of /WE, /OE, /LB, /UB and /CS. Reference numeral ADD_SUM is a summation of all addresses.

Components 100 to 400 will be described in detail below.

Figure 4:
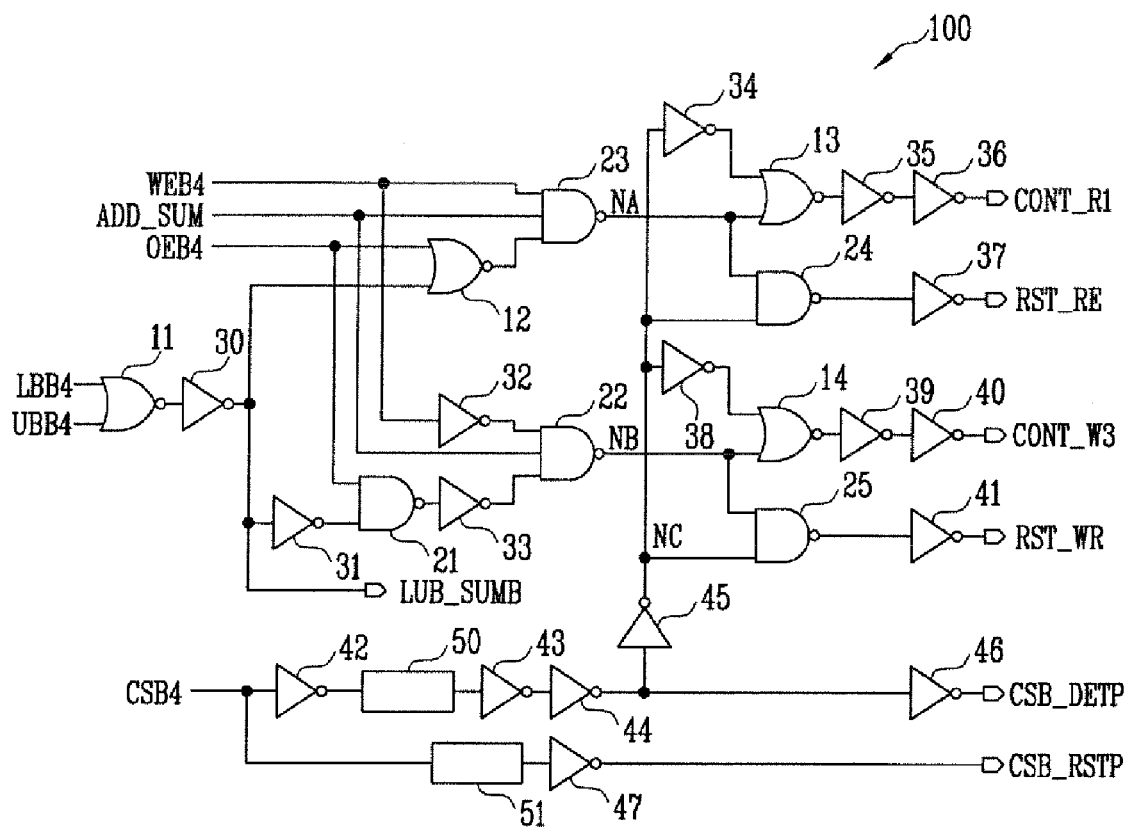
FIG. 4 is a circuit diagram of a first update control signal generator shown in FIG. 3.

FIG. 4 is a circuit diagram of a first update control signal generator shown in FIG. 3. Referring to FIG. 4, the first update control signal generation unit 100 generates a read control signal CONT_R1 for controlling the read operation of software register update and a read reset signal RST_RE for resetting the read operation, by using WEB4, ADD_SUM, OEB4, LBB4, UBB4 and CSB4; a write control signal CONT_W3 for controlling a write operation of software register update and a write reset signal RST_WR for resetting the write operation; and CSB_DETP that becomes high level when the chip select bar signal CSB4 shifts from high to low and CSB_RSTP that becomes high level when the chip select bar signal CSB4 shifts from low to high.

This will be described in more detail. The first update control signal generator 100 includes NOR gates 11 to 14, NAND gates 21 to 25, inverters 30 to 47, and pulse generators 50 and 51.

The NOR gate 11 performs a NOR operation on LBB4 and UBB4. The inverter 30 performs a NOR operation on the output signal of the NOR gate 11. The NOR gate 12 performs a NOR operation on OEB4 and the output signal of the inverter 30. The NAND gate 23 performs a NAND operation on the output signal of the NOR gate 12, WEB4 and ADD_SUM, and outputs the result to a node NA. The inverter 31 inverts the output signal of the inverter 30 to generate LUB_SUMB where LUBB4 and UBB4 are summed. The NAND gate 21 performs a NAND operation on the output signal of the inverter 31 and OEB4. The inverter 33 inverts the output signal of the NAND gate 21. The inverter 32 inverts WEB4. The NAND gate 22 performs a NAND operation on the output signals of the inverters 32, 33 and ADD_SUM, and outputs the result to a node NB. The inverter 42 inverts CSB4. The pulse generator 50 receives the output signal of the inverter 42 and outputs a signal of logic low. The inverters 43, 44 delay the output signal of the pulse generator 50 for a predetermined time. The inverter 45 inverts the output signal of the inverter 44, and outputs the result to a node NC. The inverter 34 inverts the signal of the node NC. The NOR gate 13 performs a NOR operation on the output signal of the inverter 34 and the signal of the node NA. The inverters 35, 36 temporarily store the output signal of the NOR gate 13, and output the read control signal CONT_R1 for controlling the read operation of software register update. The NAND gate 24 performs a NAND operation on the signal of the node NA and the signal of the node NC. The inverter 37 inverts the output signal of the NAND gate 24, and outputs the read reset signal RST_RE for resetting the read operation of software register update. The inverter 38 inverts the signal of the node NC. The NOR gate 14 performs a NOR operation on the output signal of the inverter 38 and the signal of the node NB. The inverters 39,40 temporarily store the output signal of the NOR gate 14, and output the write control signal CONT_W3 for controlling the write operation of software register update. The NAND gate 25 performs a NAND operation the signal of the node NB and the signal of the node NC. The inverter 41 inverts the output signal of the NAND gate 25, and outputs the write reset signal RST_WR for resetting the write operation of software register update. The inverter 46 inverts the output signal of the inverter 44, and outputs CSB_DETP that becomes high level when CSB4 shifts from high to low. The pulse generator 51 receives CSB4 and outputs a signal of logic low. The inverter 47 inverts the output signal of the pulse generator 500, and generates CSB_RSTP that becomes high level when CSB4 shifts from low to high.

Figure 5:
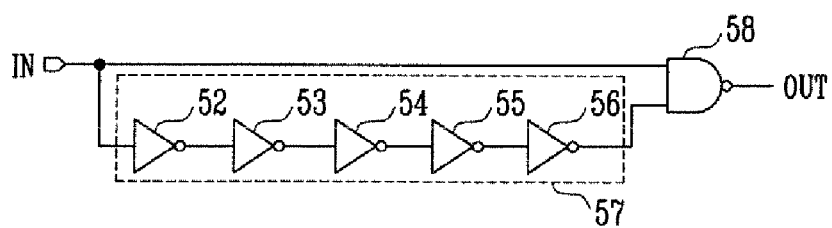
FIG. 5 is a detailed circuit diagram of the pulse generator shown in FIG. 4.

FIG. 5 is a detailed circuit diagram of the pulse generator shown in FIG. 4. The pulse generator outputs a signal of logic low when an input signal shifts from logic low to logic high.

Referring to FIG. 5, the pulse generator includes a delay circuit 57 and a NAND gate 58. The delay circuit 57 includes inverters 52 to 56, and delays the input signal to output an inversion signal of the input signal. The NAND gate 58 performs a NAND operation on the input signal and the output signal of the delay circuit 57.

Hereinafter, the operation of the first update control signal generator 100 will be described with reference to FIGS. 4 and 5.

In the software register update mode, if a condition corresponds to a first read cycle time, the read control signal CON_R1 is enabled to logic high. That is, the first read cycle condition is a state where WEB4 is logic high (/WE is logic high), LBB4, UBB4, and OEB4 are logic low (/LB, /UB and /OE are logic low), and ADD_SUM is logic high (all input addresses are logic high). In this state, if CSB4 shifts from high to low, the node NA becomes low level, the node NB becomes high level, and the node NC becomes high level. Then, the read control signal CONT_R1 becomes high level, the read reset signal RST_RE becomes low level, the write control signal CONT_W3 becomes low level, and the write reset signal RST_WR becomes high level. Since the read reset signal RST_RE is logic low, a latch circuit (to be described later), which is controlled by the read reset signal RST_RE, is not reset. Since the write reset signal RST_WR is logic high, a latch circuit (to be described later), which is controlled by the write reset signal RST_WR, is reset. At this time, if CSB4 shifts from high to low, the pulse generator 50 generates a signal of logic low, so that CSB_DETP becomes high level. When CSB4 shifts from low to high, the pulse generator 51 generates logic low, so that CSB_RSTP becomes high level.

Next, in the software register update mode, if a condition corresponds to a third write cycle time, the write control signal CON_W3 is enabled to logic high. That is, the third write cycle condition is a state where WEB4 is logic low, LBB4, UBB4, and OEB4 are logic low, and ADD_SUM is logic high. In this state, if CSB4 shifts from high to low, the node NA becomes high level, the node NB becomes low level, and the node NC becomes high level. Then, the read control signal CONT_R1 becomes low level, the read reset signal RST_RE becomes high level, the write control signal CONT_W3 becomes high level, and the write reset signal RST_WR becomes low level. Because the read reset signal RST_RE is logic high, a latch circuit (to be described later), which is controlled by the read reset signal RST_RE, is reset. Because the write reset signal RST_WR is logic low, a latch circuit (to be described later), which is controlled by the write reset signal RST_WR, is not reset.

Figure 6:
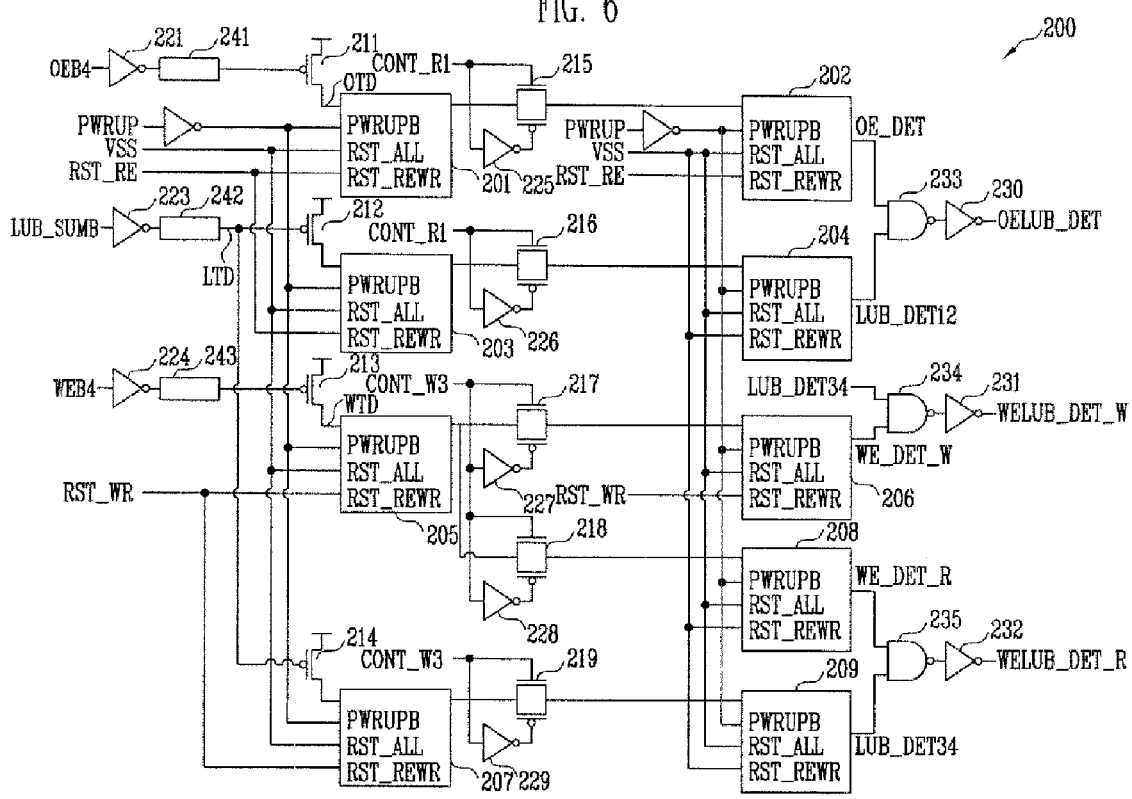
FIG. 6 is a circuit diagram of a second update control signal decision unit shown in FIG. 3.

FIG. 6 is a circuit diagram of the second update control signal decision unit 200 shown in FIG. 3. This unit generates OELUB_DET for determining whether to generate a read control signal CONT_R2, WELUB_DET_W for determining whether to generate a write control signal CONT_W4, and WELUB_DET_R for determining whether to generate a read control signal CONT_R4, by detecting that /OE, /LB, /UB, and /WE (=OEB4, LBB4, UBB4, WEB4) shift from high to low.

Referring to FIG. 6, the second update control signal decision unit 200 includes latch circuits 201 to 209, pulse generators 241 to 243, PMOS transistors 211 to 214, transfer gates 215 to 219, inverters 221, and 223 to 232, and NAND gates 233 to 235.

If /OE (=OEB4) shifts from high to low, the inverter 221 inverts OEB4. If the pulse generator 241 receives the output signal of the inverter 221, and outputs a signal of logic low, the PMOS transistor 211 is turned on, and a node ODT becomes high level. Thus, the latch circuit 201 latches the logic high. At this time, if the read control signal CONT_R1 is enabled to logic high, the transfer gate 215 transfers the signal of logic high of the latch circuit 201 to a next latch circuit 202. The latch circuit 202 latches the signal of logic high, and then outputs OE_DET as logic high.

In the same manner, if both /LB and /UB (LBB4, UBB4) shift from high to low, the inverter 223 inverts LUB_SUMB. If the pulse generator 242 receives the output signal of the inverter 223 and outputs the signal to a node LDT as logic low, the PMOS transistor 212 is turned on, and the latch circuit 203 latches logic high. At this time, if the read control signal CONT_R1 is enabled to logic high, the transfer gate 216 transfers the signal of the logic high of the latch circuit 203 to a next latch circuit 204. The latch circuit 204 latches the signal of the logic high, and then outputs LUB_DET12 as logic high. Then, the NAND gate 233 performs a NAND operation on OE_DET and LUB_DET12 to output a signal of logic low. The inverter 230 inverts the logic low of the NAND gate 233 to output OELUB_DET of logic high. OELUB_DET of the logic high enables the second update control signal generator 300 so that the read control signal CONT_R2 is generated.

Thereafter, if /LB, /UB (LBB4, UBB4) shift from high to low, the node LTD becomes low level, and the PMOS transistor 214 is turned on. Then, the latch circuit 207 latches logic high. At this time, if a write control signal CONT_W3 is enabled to logic high, the transfer gate 219 transfers the logic high signal of the latch circuit 207 to the latch circuit 209. The latch circuit 209 latches the logic high, and then outputs LUB_DT34 as logic high.

In a state where LUB_DET34 is logic high, if the condition becomes a write operation condition of third software register update by means of /WE (WEB4), the inverter 224 inverts WEB4 and output the inverted signal. If the pulse generator 243 receives the output signal of the inverter 224 to output logic low, the PMOS transistor 213 is turned on, and the node WTD becomes high level. Then, the latch circuit 205 latches logic high. At this time, if the write control signal CONT_W3 is enabled to logic high, the transfer gate 217 transfers the logic high signal of the latch circuit 205 to the latch circuit 206, and the transfer gate 218 transfers the logic high signal of the latch circuit 205 to the latch circuit 208. At this time, in the case of the write cycle time of the fourth software register update, if a read reset signal RST_RE is input as logic high, the latch circuit 208 is reset, and WE_DET_R is disabled to logic low. The latch circuit 206 latches the logic high, and then outputs WE_DET_W as logic high. The NAND gate 234 performs a NAND operation on LUB_DET34 and WE_DET_W of the logic high to output logic low. The inverter 231 inverts logic low of the NAND gate 234 to output WELUB_DET_W of logic high. WELUB_DET_W of the logic high enables the second update control signal generator 300 in order to generate a write control signal CONT_W4.

In the case of the read cycle time of fourth software register update, as a write reset signal RST_WR is input as logic high contrary to the write cycle time, the latch circuit 206 is reset and WE_DET_W is disabled to logic low. The latch circuit 208 latches logic high, and then outputs WE_DET_R of logic high. The NAND gate 235 performs a NAND operation on WE_DET_R of the logic high and LUB_DET34 of the logic high to output logic low. The inverter 232 inverts the logic low of the NAND gate 235 to output WELUB_DET_R of logic high. WELUB_DET_R of the logic high enables the second update control signal generator 300 in order to generate the read control signal CONT_R4.

Figure 7:
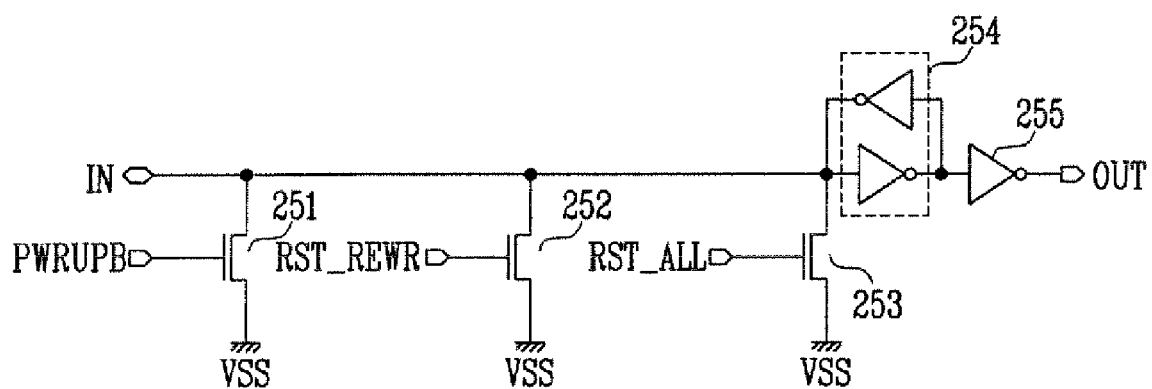
FIG. 7 is a detailed circuit diagram of latch circuits shown in FIG. 6.

FIG. 7 is a detailed circuit diagram of each of the latch circuits 201 to 209 shown in FIG. 6. If an inverse signal PWRUPB of a power-up signal, the read or write reset signal RST_REWE, and all the latch reset signals RST_ALL are at a logic low, the latch circuits latch the input signals. If any one of the inverse signal PWRUPB of the power-up signal, the read or write reset signal RST_REWE, and all the latch reset signal RST_ALL is at a logic high, the latch circuits latch a logic low.

Referring to FIG. 7, each of the latch circuits includes NMOS transistors 251 to 253, an inverter latch 254, and an inverter 255. The NMOS transistor 251 has one end connected to an input node, and the other end connected to a ground voltage VSS. The NMOS transistor 251 has a gate to which the inverse signal PWRPUB of the power-up signal is input, so that it is turned on/off. The NMOS transistor 252 has one end connected to the input node, and the other end connected to the ground voltage VSS. The NMOS transistor 252 has a gate to which a read or write reset signal RST_REWE is input, so that it is turned on/off. The NMOS transistor 253 has one end connected to the input node and the other end connected to the ground voltage VSS. The NMOS transistor 253 has a gate to which an all latch-reset signal RST_ALL is input, so that it is turned on/off. The latch 254 latches the signal of the input node, and the inverter 255 inverts the output signal of the latch 254.

The latch circuits of FIGS. 8 and 9 to be described later are the same as that shown in FIG. 7. Thus, reference to the description of FIG. 7 can be made for description on the construction and operation of the latch circuits of FIGS. 8 and 9.

Figure 8:
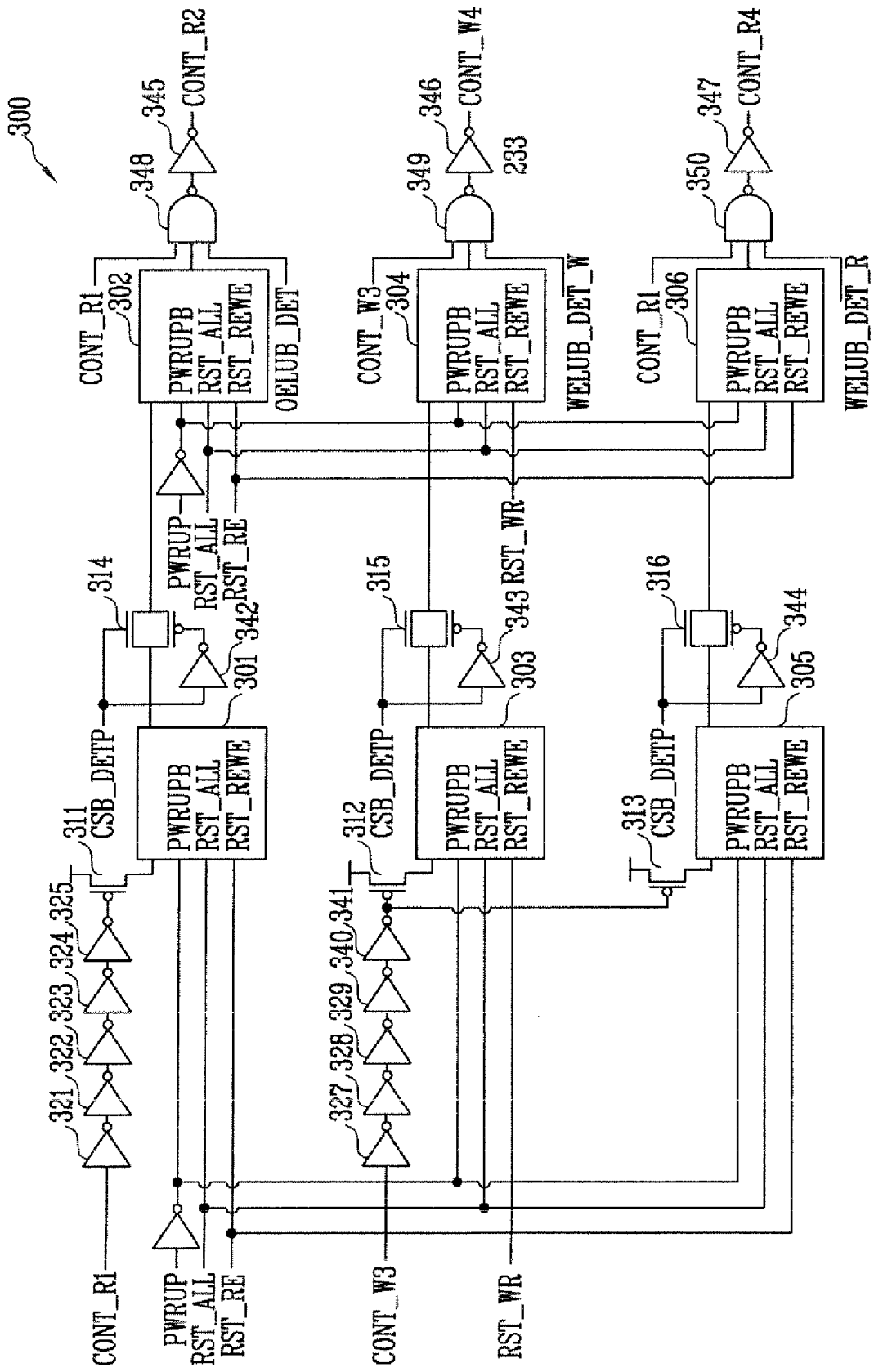
FIG. 8 is a circuit diagram of a second update control signal generator shown in FIG. 3.

FIG. 8 is a circuit diagram of the second update control signal generator. The second update control signal generator 300 generates a read control signal CONT_R2 using read control signals CONT_R1 and OELUB_DET in the case of the second read cycle time of software register update. In the case of the fourth write cycle time of software register update, the second update control signal generator 300 generates a write control signal CONT_W4 using a write control signal CONT_W3 and WELUB_DET_W. In the case of the fourth read cycle time of the software register update, the second update control signal generator 300 generates a read control signal CONT_R4 using read control signals CONT_R1 and WELUB_DET_R.

Referring to FIG. 8, the second update control signal generator 300 includes latch circuits 301 to 306, PMOS transistors 311 to 313, transfer gates 314 to 316, NAND gates 348 to 350, inverters 321 to 325, and 327 to 347.

If the read control signal CONT_R1 is input as logic high, the inverter 321-325 temporarily stores the signal, and then outputs it as logic low. At this time, the PMOS transistor 311 is turned on, and the latch circuit 301 latches the logic high. In the case of the second read cycle time of software register update /CS, i.e., if CSB4 shifts from high to low, CSB_DETP becomes logic high, and the transfer gate 314 transfers the logic high signal of the latch circuit 301 to the latch circuit 302. Then, the NAND gate 348 performs a NAND operation on the output signal of the logic high from the latch circuit 302, OELUB_DET of the logic high, and the read control signal CONT_R1 of the logic high, and then outputs logic low. The inverter 345 inverts logic low to output the read control signal CONT_R2 of logic high.

In the same manner, if the write control signal CONT_W3 is enabled to logic high, the inverter 327-341 temporarily stores the signal, and then outputs logic low. Then, the PMOS transistor 312 is turned on, and the latch circuit 303 thus latches logic high. The PMOS transistor 313 is turned on, and the latch circuit 305 thus latches logic high.

If a fourth condition of software register update is the write cycle time, the read reset signal RST_RE becomes logic high, the latch circuit 306 is disabled. In the fourth write cycle time /CS, i.e., if CSB4 shifts from high to low, CSB_DETP becomes logic high, and the transfer gate 315 transfers logic high of the latch circuit 303 to the latch circuit 304. Then, the NAND gate 349 performs a NAND operation on the output signal of the logic high from the latch circuit 303, WELUB_DET_W of logic high, and the write control signal CONT_W3 of the logic high, and then outputs logic low. The inverter 346 inverts logic low to output the write control signal CONT_W4 of logic high.

Furthermore, if the software register update condition is a fourth read cycle time, the write reset signal RST_WR becomes logic high, and the latch circuit 304 is disabled. In the fourth read cycle time /CS, i.e., if CSB4 shifts from high to low, CSB_DETP becomes logic high, and the transfer gate 316 transfers logic high of the latch circuit 305 to the latch circuit 306. Then, the NAND gate 350 performs a NAND operation on the output signal of the logic high from the latch circuit 306, WELUB_DET_R of logic high, and the read control signal CONT_R1 of logic high, and outputs logic low. The inverter 347 inverts logic low, and outputs the read control signal CONT_R4 of logic high.

If the condition is not the software register update condition, the write reset signal RST_WR and the read reset signal RST_RE are input as logic high, and the latch circuits 301 to 306 are disabled. Then, the read control signal CONT_R2, the write control signal CONT_W4 and the read control signal CONT_R4 are not generated.

Figure 9:
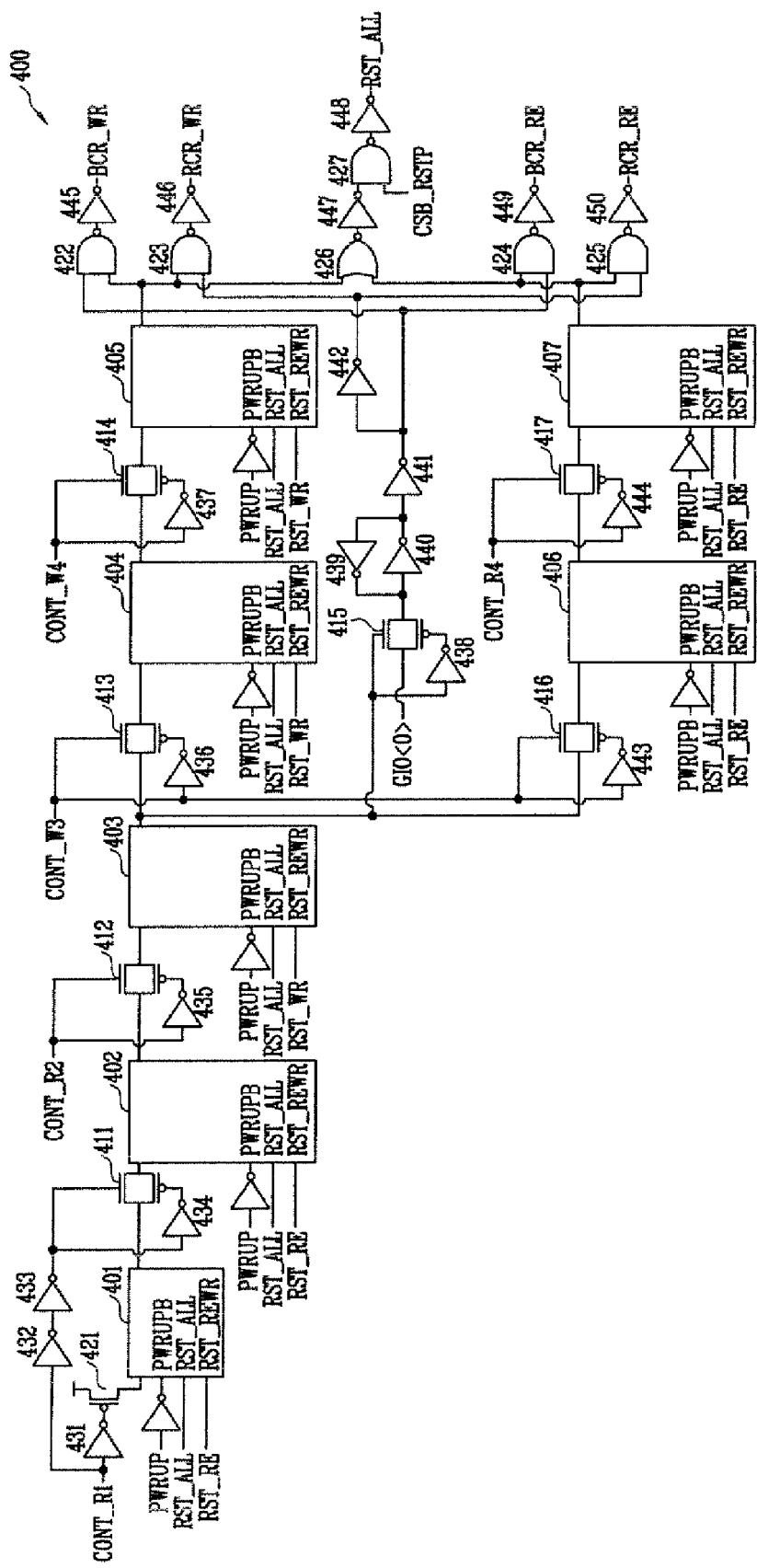
FIG. 9 is a circuit diagram of a register update unit shown in FIG. 3.

FIG. 9 is a circuit diagram of the register update unit shown in FIG. 3. The register update unit 400 writes data, which are received from the data I/O pad, into a bus configuration register (not shown) or a refresh configuration register (not shown), or reads data, which are updated in the bus configuration register or the refresh configuration register, and then transfers them to the outside through the data I/O pad, according to an enable sequence of the read control signals CONT_R1, CONT_R2 and CONT_R4, and the write control signals CONT_W3 and CONT_W4.

Referring to FIG. 9, the register update unit 400 includes latch circuits 401 to 407, transfer gates 411 to 417, a PMOS transistor 421, NAND gates 422 to 425, a NOR gate 426, a NAND gate 427, and inverters 431 to 450.

Reference numerals will be first described. BCR_WR is a signal for updating the bus configuration register by writing data received from the data I/O pad into the bus configuration register. BCR_RE is a signal for reading updated data from the bus configuration register. RCR_WR is a signal for updating the refresh configuration register by writing data received from the data I/O pad into the refresh configuration register. RCR_WR is a signal for reading updated data from the refresh configuration register. GIO<1> are data which are buffered in the data I/O pad (DQ pad) and then received therefrom.

When the read control signal CONT_R1 is enabled to logic high, if the inverter 431 inverts the read control signal CONT_R1 of logic high and outputs the inverted signal, the PMOS transistor 421 is turned on, and the latch circuit 401 latches the logic high. If the inverter 432, 433 temporarily store the read control signal CONT_R1 and output logic high, the transfer gate 411 transfers the logic high signal of the latch circuit 401 to the latch circuit 402. Thereafter, if the read control signal CONT_R2 is input as logic high, the transfer gate 412 transfers logic high of the latch circuit 402 to the latch circuit 403. If the write control signal CONT_W3 is then input as logic high, the transfer gate 413 transfers the logic high signal of the latch circuit 403 to the latch circuit 404, and the transfer gate 416 transfers logic high of the latch circuit 403 to the latch circuit 406. Next, if the write control signal CONT_W4 is input as logic high, i.e., if the fourth software register update condition is write cycle time, the transfer gate 414 transfers logic high of the latch circuit 404 to the latch circuit 405, and the latch circuit 405 latches the logic high. At this time, if data GIO(1) received from the data I/O pad is logic high, the transfer gate 415 outputs GIO(0) of logic high. Then, the NAND gate 422 performs a NAND operation on the logic high to output logic low, and the inverter 445 inverts the logic low to output BCR_WR of logic high. In this case, since the write control signal CONT_W4 is logic high, the read reset signal RST_RE becomes logic high, and the latch circuits 406, 407 are thus disabled. If the fourth software register update condition is a read cycle time, i.e., if the read control signal CONT_R4 is input as logic high, the transfer gate 417 transfers the logic high signal of the latch circuit 406 to the latch circuit 407, and the latch circuit 405 latches the logic high. At this time, if data GIO(1) received from the data I/O pad is logic low, the transfer gate 415 outputs GIO(1) of logic low. Then, the NAND gate 425 performs a NAND operation on the logic high to output logic low, and the inverter 450 inverts the logic low to output RCR_RE of logic high. At this time, since the read control signal CONT_R4 is logic high, the write reset signal RST_WR is input to the latch circuits 404, 405 as logic high, and the latch circuits 404, 405 are disabled.

That is, if data GIO<1> received from the data I/O pad is logic high, BCR_WR or BCR_RE is enabled. If GIO<1> is logic low, RCR_WR and RCR_RE are enabled. If CONT_R1, CONT_R2, CONT_W3 and CONT_W4 are sequentially enabled and GIO<1> is logic high, BCR_WR is enabled. Thus, data received from the DQ pad are written into the bus configuration register, and the bus configuration register is updated. If CONT_R1, CONT_R2, CONT_W3 and CONT_R4 are sequentially enabled and GIO<1> is logic high, BCR_RE is enabled, and updated data are read from the bus configuration register, and are then transferred to the outside through the DQ pad. If CONT_R1, CONT_R2, CONT_W3 and CONT_W4 are sequentially enabled and GIO<1> is logic low, RCR_WR is enabled, data received from the DQ pad are written into the refresh configuration register, and the refresh configuration register is updated. If CONT_R1, CONT_R2, CONT_W3 and CONT_R4 are sequentially enabled and GIO<1> is logic low, RCR_RE is enabled, and updated data are read from the refresh configuration register and are then transferred to the outside through the DQ pad. As the read operation is performed as described above, updated data that were not able to read conventionally can be read.

If CONT_R1, CONT_R2, CONT_W3 and CONT_W4 or CONT_R4 are not consecutively enabled, the read reset signal RST_RE and the write reset signal RST_WR become logic high, and the latch circuit is thus disabled. In this case, BCR_WR, BCR_RE or RCR_WR and RCR_RE are not generated.

Moreover, since the power-up signal PWRUP shifts from low to high at the moment when initial power is on, all the latch circuits latch logic low as an initial value according to the inverse signal PWRUPB of the power-up signal. Furthermore, if the chip select bar signal /CS shifts from low to high, CSB_RSTP is enabled to logic high with BCR_WR. BCR_RE, RCR_WR and RCR_RE being enabled, all latch reset signal RST_ALL becomes logic high, and all the latch circuits are disabled.

Figure 10:
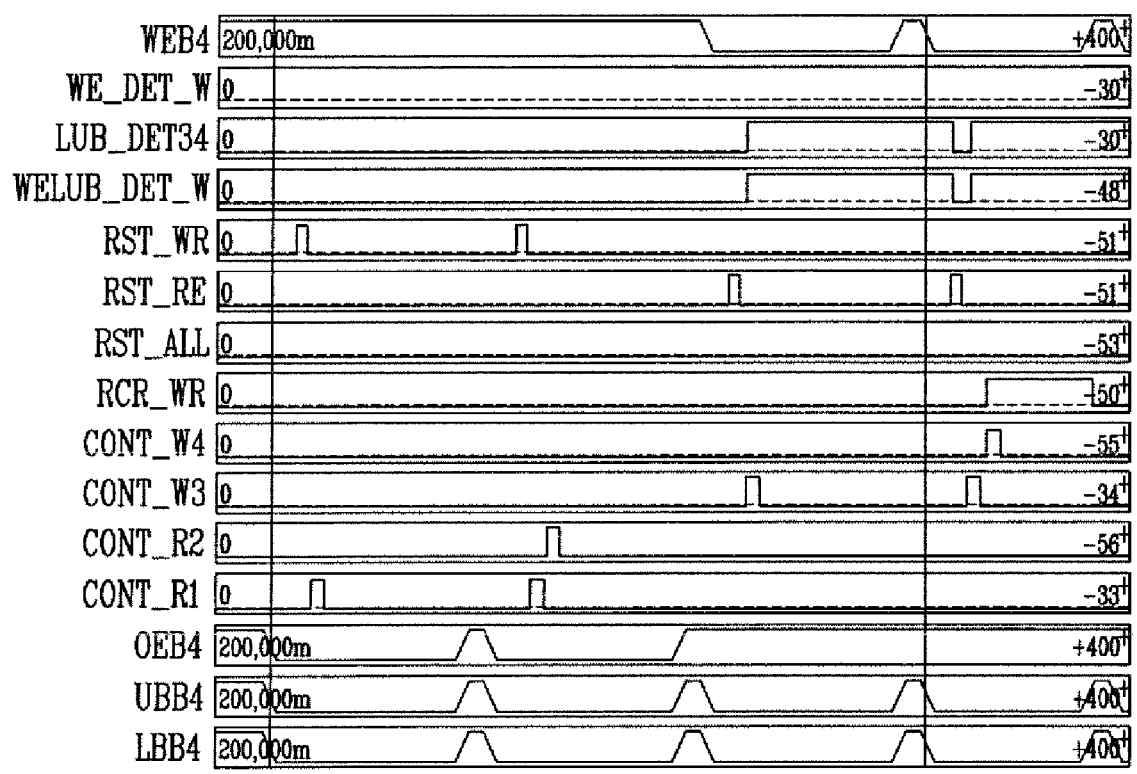
FIG. 10 is a timing diagram showing a simulation result of a write mode of a refresh configuration register shown in FIG. 3.
Figure 11:
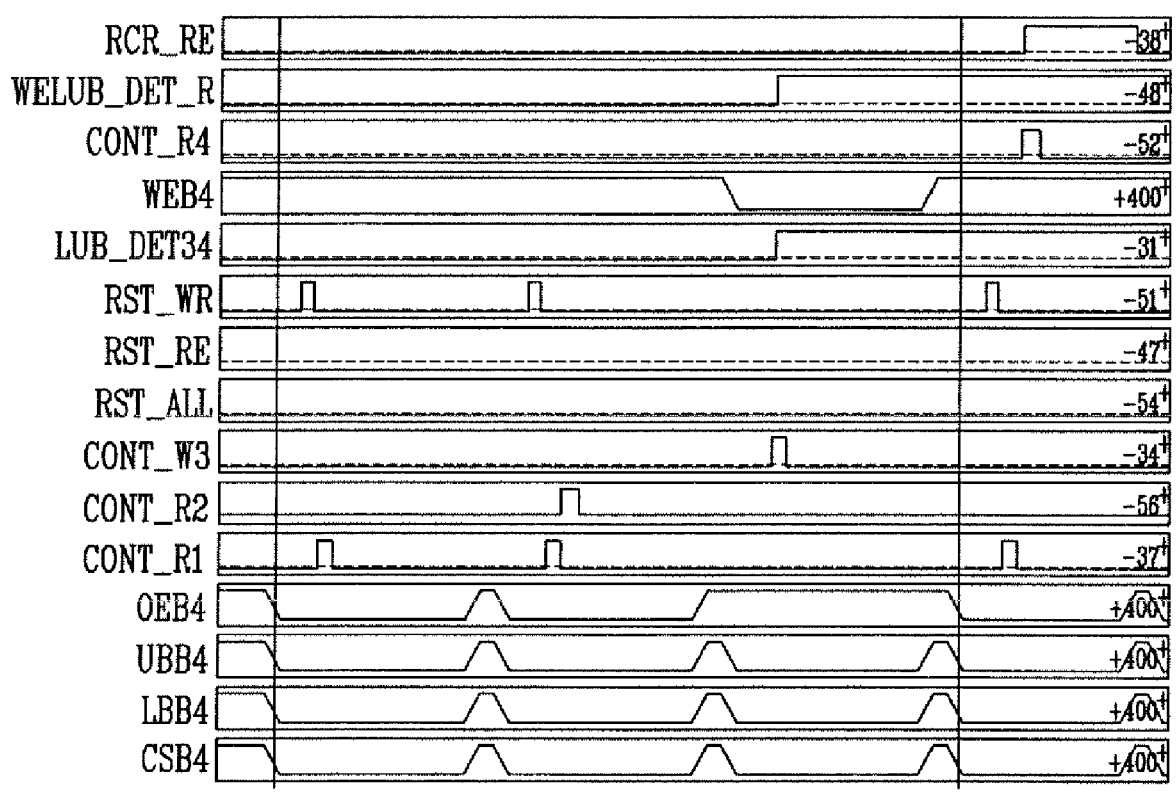
FIG. 11 is a timing diagram showing a simulation result of a read mode of a refresh configuration register shown in FIG. 3.

FIG. 10 is a timing diagram showing a simulation result of the write mode of the refresh configuration register shown in FIG. 3. FIG. 11 is a timing diagram showing a simulation result of the read mode of the refresh configuration register.

As described above, if the software register update condition is a read condition, the read control signal CONT_R1 is enabled to logic high. If the second software register update condition is a read condition, the read control signal CONT_R2 is enabled logic high. After the control signals CONT_R1, CONT_R2 are enabled, the third software register update condition is a write condition, the write control signal CONT_W3 is enabled to logic high. After the read control signals CONT_R1, CONT_R2, and the write control signal CONT_W3 are consecutively enabled, if the fourth software register update condition is a write condition, the write control signal CONT_W4 is enabled to logic high. On the other hand, if the fourth software register update condition is the read condition, the read control signal CONT_R4 is enabled to logic high. If the input signals are not input in the sequence described above, i.e., a combination of the input signals is not input like FIGS. 1 and 2, the read rest signal RST_RE or the write reset signal RST_WE is enabled to logic high, and the mode does not enter the software register update mode.

As described above, necessary data are not received from an address so as to set a conventional mode register, but relevant data are received from a data I/O pin. This is advantageous in that it can set mode register update.

Furthermore, in a method of setting a mode register using a conventional address, setting result cannot be read. In a software register update, however, there is an advantage in that setting result can be read.

Although the foregoing description has been made with reference to the preferred embodiments, it is to be understood that changes and modifications of the present invention may be made by the ordinary skilled in the art without departing from the spirit and scope of the present invention and appended claims.

What is claimed as new and desired to be protected by Letters Patent of the United States is:

1. A method of updating a software register, comprising the steps of:
   receiving necessary data from a data I/O pad;
   writing the data received from the data I/O pad into the software register in an order of a read cycle time, a read cycle time, a write cycle time and a write cycle time, thereby updating the software register; and
   reading the updated data from the software register, and transferring the data to the outside through the data I/O pad.

2. The method as claimed in claim 1, wherein in a fourth write cycle time, the received data are written into a mode register.

3. The method as claimed in claim 1, wherein the update step includes reading the updated data from the software register in an order of a read cycle time, a read cycle time, a write cycle time and a read cycle time.

4. The method as claimed in claim 3, wherein in a fourth read cycle time, the updated data are read from the software register.

5. The method as claimed in claim 1, wherein the update step includes the steps of:
   generating a first read control signal and a first write control signal for updating the software register; and
   generating a second read control signal using the first read control signal, and a second write control signal and a third read control signal using the first write control signal.

6. The method as claimed in claim 5, wherein the first read control signal and the first write control signal are generated using a summation signal of a chip select bar signal, an output enable bar signal, a write enable bar signal, a lower bit bar signal of output data, an upper bit bar signal of output data, and an address.

7. The method as claimed in claim 5, wherein if the first read control signal, the second read control signal, the first write control signal, and the second write control signal, are sequentially enabled, data received from the data I/O pad are written into the software register.

8. The method as claimed in claim 5, wherein if the first read control signal, the second read control signal, the first write control signal, and the third read control signal are sequentially enabled, the updated data are read from the software register.

9. The method as claimed in claim 1, wherein the software register is a bus configuration register or a refresh configuration register.

10. The method as claimed in claim 9, wherein if the data received from the data I/O pad is logic high, the received data is written into the bus configuration register, or the updated data is read from the bus configuration register.

11. The method as claimed in claim 9, wherein if the data received from the data I/O pad is logic low, the received data is written into the refresh configuration register, or the updated data is read from the refresh configuration register.

12. A circuit for updating a software register by using necessary data received from a data I/O pad, comprising:
   a first register control signal generator is configured to generate a first read control signal and a first write control signal to update the software register;
   a second register control signal generator is configured to generate a second read control signal using the first read control signal, and generate a second write control signal and a third read control signal using the first write control signal; and a register update unit is configured to update data in the software register received from the data I/O pad into the software register, or reading the updated data from the software register, in an order in which the first to third read control signals, and the first and second write control signals are enabled.

13. The circuit as claimed in claim 12, wherein the register update unit is adapted to write the data received from the data I/O pad into the software register, if the first read control signal, the second read control signal, the first write control signal and the second write control signal are sequentially enabled.

14. The circuit as claimed in claim 12, wherein the register update unit is adapted to read the updated data from the software register, if the first read control signal, the second read control signal, the first write control signal and the second write control signal are sequentially enabled.

15. The circuit as claimed in claim 12, wherein the first register control signal generator is adapted to generate the first read control signal and the first write control signal by using a summation signal of all of a chip select bar signal, an output enable bar signal, a write enable bar signal, an upper bit bar signal of output data, a lower bit bar signal of output data, and an address.

16. The circuit as claimed in claim 12, further comprising a second update control signal decision unit that generates a first signal that determines whether to generate the second read control signal, a second signal that determines whether to generate the second write control signal, and a third signal that determines whether to generate the third read control signal.

17. The circuit as claimed in claim 16, wherein the second update control signal decision unit is adapted to generate the first to third signals by using an output enable bar signal, a summation signal of upper/lower bit bar signals of output data, and a write enable bar signal.

18. The circuit as claimed in claim 12, wherein the software register is a bus configuration register or a refresh configuration register.

19. The circuit as claimed in claim 18, wherein if the data received from the data I/O pad is logic high, the received data are written into the bus configuration register, or the updated data are read from the bus configuration register.

20. The circuit as claimed in claim 18, wherein if the data received from the data I/O pad is logic high, the received data are written into the refresh configuration register, or the updated data are read from the refresh configuration register.

21. The circuit as claimed in claim 12, wherein the software register is a mode register constructed to a semiconductor memory device.

* * * * *